United States Patent
Froitzheim et al.

(10) Patent No.: US 10,109,911 B2
(45) Date of Patent: Oct. 23, 2018

(54) DRIVER CIRCUIT FOR AN INDUCTOR AND ACTIVE TRANSMITTER DEVICE HAVING A DRIVER CIRCUIT

(71) Applicant: Continental Automotive GmbH, Hannover (DE)

(72) Inventors: Herbert Froitzheim, Pettendorf (DE); Dieter Sass, Regensberg (DE); Norbert Van Der Heyd, Bad Abbach (DE)

(73) Assignee: Continental Automotive GmbH, Hannover (DE)

( * ) Notice: Subject to any disclaimer, the term of this patent is extended or adjusted under 35 U.S.C. 154(b) by 14 days.

(21) Appl. No.: 15/524,265

(22) PCT Filed: Nov. 3, 2015

(86) PCT No.: PCT/EP2015/075530
§ 371 (c)(1),
(2) Date: May 3, 2017

(87) PCT Pub. No.: WO2016/071312
PCT Pub. Date: May 12, 2016

(65) Prior Publication Data
US 2017/0331179 A1   Nov. 16, 2017

(30) Foreign Application Priority Data

Nov. 5, 2014 (DE) ............ 10 2014 222 603

(51) Int. Cl.
*H01Q 1/32* (2006.01)
*H01Q 23/00* (2006.01)
(Continued)

(52) U.S. Cl.
CPC ......... *H01Q 1/3241* (2013.01); *H01Q 1/3216* (2013.01); *H01Q 23/00* (2013.01);
(Continued)

(58) Field of Classification Search
CPC .... H01Q 1/3241; H01Q 1/3216; H01Q 23/00; H04B 1/04; H03K 17/13; H03K 17/165; H03K 2217/0054
See application file for complete search history.

(56) References Cited

U.S. PATENT DOCUMENTS 4,577,171 A * 3/1986 Heigl ............... H03J 5/244
333/103
5,239,669 A * 8/1993 Mason ............... G01S 19/36
343/700 MS
(Continued)

FOREIGN PATENT DOCUMENTS

DE    19702841 A1   7/1998
DE  102005032379 A1   1/2007
(Continued)

OTHER PUBLICATIONS

International Search Report and Written Opinion dated Feb. 18, 2016 from corresponding International Patent Application No. PCT/EP2015/075530.

*Primary Examiner* — Tho G Phan (57) ABSTRACT

The invention relates to a driver circuit and an active transmitter device, a series circuit consisting of a first capacitor (4) and a second capacitor (12) being charged to a reference voltage by way of a charging current and the charged capacitors being discharged via the inductor (1) by an oscillating discharge, the discharge being terminated when the current through the inductor has completed an entire oscillation period or a multiple thereof.

13 Claims, 6 Drawing Sheets

(51) Int. Cl.
  *H04B 1/04* (2006.01)
  *H03K 17/13* (2006.01)
  *H03K 17/16* (2006.01)
  *G07C 9/00* (2006.01)

(52) U.S. Cl.
  CPC ......... *H03K 17/13* (2013.01); *H03K 17/165* (2013.01); *H04B 1/04* (2013.01); *G07C 9/00309* (2013.01); *H03K 2217/0054* (2013.01)

(56) References Cited

U.S. PATENT DOCUMENTS

| | | | |
|---|---|---|---|
| 6,229,494 B1 | 5/2001 | Merenda | |
| 8,165,535 B2* | 4/2012 | Ahn | H04B 1/48 343/876 |
| 8,405,561 B2* | 3/2013 | Handy | H01Q 21/065 343/705 |
| 9,148,189 B2* | 9/2015 | Froitzheim | H04B 1/18 |
| 9,407,258 B1* | 8/2016 | Kofler | H03K 7/08 |
| 2006/0170610 A1* | 8/2006 | Rabinovich | H01Q 1/243 343/895 |

FOREIGN PATENT DOCUMENTS

| | | |
|---|---|---|
| DE | 102006024467 A1 | 11/2007 |
| DE | 102009023855 A1 | 12/2010 |
| DE | 102013220596 A1 | 4/2015 |
| WO | 2015/052033 A1 | 4/2015 |

* cited by examiner

DRIVER CIRCUIT FOR AN INDUCTOR AND ACTIVE TRANSMITTER DEVICE HAVING A DRIVER CIRCUIT

The invention relates to a driver circuit for an inductance, particularly an inductive antenna, and an active transmission device having a driver circuit, particularly for a keyless vehicle entry and starting system.

Keyless vehicle entry and starting systems, such as the passive start entry (PASE) system, for example, are automatic systems to unlock a vehicle without actively using a car key and to start said vehicle by merely operating the starting button. This is made possible by an electronic key with a chip that the vehicle driver carries with him. Periodically, the vehicle uses at least one antenna on the vehicle to transmit an encoded enquiry signal at an LF frequency (LF stands for "low frequency" at frequencies between 20 kHz and 200 kHz, for example). The system then changes to a reception mode in the UHF band (UHF stands for "ultra high frequency" at frequencies in the three-digit MHz range, for example) and awaits confirmation. If a key equipped with a transponder is in range, then it receives the LF signal, decodes it and transmits it again with a new coding as a UHF signal. The UHF signal is decoded in the vehicle. Since the vehicle knows both coding tables, it can compare its own original transmission with the currently received signal and allow entry in the event of a match. If there is no correct response within a defined time, nothing happens and the system switches to standby again. The engine starting process essentially corresponds to that of entry control, the only difference being that in this case the engine starting button needs to be operated.

The antenna used for transmitting the LF signal is predominantly an inductive antenna that is embodied as a ferrite core provided with a winding (also known as a magnetic antenna or ferrite antenna), for example. In this case, the inductance of the inductive antenna is frequently operated together with a capacitor in a resonant circuit. The energy consumption of such a resonant circuit is usually kept low by a quality factor that is as high as possible and by an exact frequency tuning, in order to minimize the total current consumption of the entry and starting system. A low current consumption is desirable, for example, simply because otherwise the vehicle battery would be rapidly discharged in the event of the vehicle being parked for a relatively long time. However, a high quality factor restricts the transmission data rate and an exact tuning in conjunction with the high quality factor requires some complexity. Therefore, conventional arrangements often constitute an unsatisfactory compromise between data rate, complexity and energy consumption.

Therefore, quasi-resonant circuit drivers are known, with which a high quality factor (and thus a low current consumption) can be achieved in conjunction with a simultaneously sufficiently high data rate. However, these driver circuits have the disadvantage that they do not comply with the radio approval regulations. The radio approval regulations are intended to ensure that other radio services such as e.g. broadcasting (radio and television), mobile radio services (police and security services) or cellular phones are not adversely affected in operation. A further disadvantage of these quasi-resonant driver circuits resides in the fact that the guidelines of the automobile manufacturers with regard to electromagnetic compatibility (EMC) are not complied with.

It is an object of the invention to provide a driver circuit for an inductance that is improved in this regard. In addition, the aim is to provide an improved active transmission device having a resonant circuit.

The object is achieved by a driver circuit for an inductance as claimed in claim 1 and by an active transmission device as claimed in claim 13.

The driver circuit according to the invention for an inductance comprises two series-connected capacitors, two input paths for supplying a reference voltage for the series circuit comprising the capacitors and two output paths for connecting the inductance to the series circuit comprising the capacitors. In addition, the driver circuit comprises a first controllable switch, which is connected to one of the two input paths, a second controllable switch, which is connected to one of the two output paths, and a third controllable switch, which is connected to the other of the two output paths. A resistor is connected between a common node of the two capacitors and the inductance. A current measuring device is connected to one of the two output paths and is designed to measure the current flowing through the inductance. A switch control device, which is connected downstream of the current measuring device, evaluates the current flowing through the inductance and is designed to close the first switch initially when the second and third switches are open, in order to charge the series circuit comprising the capacitors with the reference voltage, and then to open the first switch and to close the second and third switches simultaneously, in order to discharge the capacitors via the inductance in an oscillating manner, the second switch and the third switch being opened again simultaneously when the current through the inductance has passed through an entire oscillation period or a multiple thereof.

Advantages of the driver circuit according to the invention are a low circuitry and adjustment complexity, a low current consumption and lower interference signal emission. Additionally, the driver circuit according to the invention allows compliance with radio approval regulations.

The first capacitor and the second capacitor can each have the same capacitance. This allows the sum of the potentials at the connections of the inductance to be kept essentially constant during the switching processes, which reduces the emissions during switching.

The switch control device may be designed to detect the zero crossings of the measured current and, after a number of two or an integer multiple of two zero crossings, to open the second and third switches. Detection of the zero crossings is a simple and efficient way of establishing the end of an oscillation period.

The switch control device may have a modulation input for a modulation signal and be designed to control switching cycles of the first switch, the second switch and the third switch on the basis of the modulation signal in order to advantageously tap diverse application options.

The switch control device may further be designed to perform a phase shift keying modulation or an amplitude shift keying modulation or a frequency shift keying modulation for the antenna current. During modulation, the switch control device provides an effective quality factor of 1, while the resonant circuit is operated with a high quality factor and hence in a very energy saving manner.

At least the first switch, the second switch and the third switch may be embodied as controllable semiconductor components, as a result of which it is possible for switching processes to be performed in a simple manner and with little complexity, even at higher switching frequencies.

The current measuring device may be embodied as a nonreactive resistance, as a result of which it is possible for currents to be measured in a simple manner and with little complexity.

The current measuring device may alternatively be designed to evaluate the derivative of the voltage on the series circuit comprising the capacitors if current measurement is not desirable or not feasible.

Preferably, the resonant circuit formed by capacitors and inductance has a resonant frequency that is higher than a carrier frequency provided for transmission. By way of example, the resonant frequency may be 5 to 30 percent higher than the carrier frequency provided for transmission.

A fourth controllable switch may be connected in parallel with the series circuit comprising the capacitors, which controllable switch can be controlled such that it shorts the capacitors to deactivate the driver circuit. This advantageously allows a defined voltage to be impressed, in the deactivated state, across the series circuit comprising the capacitors, such as 0 V, for example.

The object is also achieved by an active transmission device having an inductive antenna, a first capacitor, a second capacitor, which is connected in series with the first capacitor, and a reference voltage. Moreover, it comprises two input paths, which are connected between the reference voltage and the series circuit comprising the capacitors, and two output paths, which are connected between the inductive antenna and the series circuit comprising the capacitors. A first controllable switch is connected to one of the two input paths, a second controllable switch is connected to one of the two output paths and a third controllable switch is connected to the other of the two output paths. A resistor is connected between a common node of the first capacitor and the second capacitor and the inductance. Additionally, a current measuring device is connected to one of the two output paths and measures the current flowing through the inductive antenna. A switch control device, which is connected downstream of the current measuring device, evaluates the current flowing through the inductive antenna and is designed to close the first switch initially when the second and third switches are open, in order to charge the series circuit comprising the first and second capacitors with the reference voltage, and then to open the first switch and to close the second and third switches simultaneously, in order to discharge the capacitors via the inductive antenna in an oscillating manner, the second switch and the third switch being opened again simultaneously when the current through the antenna has passed through an entire oscillation period or a multiple thereof. An active transmission device of this kind can be used advantageously as part of a keyless vehicle entry and starting system, for example, such as the passive start entry (PASE) system, for example.

The invention is explained in more detail below on the basis of the exemplary embodiments shown in the figures of the drawing, in which.

Figure 1:
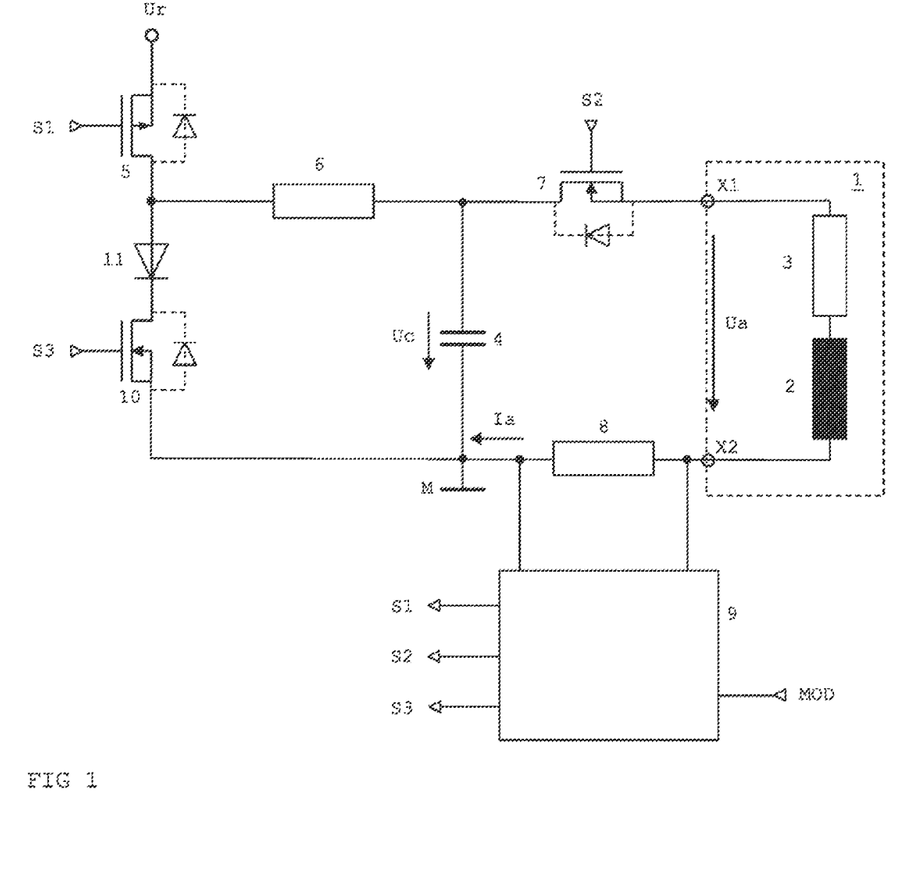
FIG. 1 shows a circuit diagram of a driver circuit for an inductance in an application as an active transmission device for LF signals.

FIG. 1 shows a driver circuit for an inductance, which, in the present case, is provided by an inductive antenna 1, such as a ferrite antenna, for example, in an application as an active transmission device. The inductive antenna 1 can alternatively be described by an electrical series circuit comprising a purely inductive component 2 and a nonreactive component 3, as shown in FIG. 1. In this case, the inductive antenna 1 has a first antenna port X1 and a second antenna port X2. A capacitor 4 is connected firstly to two input paths for supplying a reference voltage Ur referenced to ground M and two output paths for connecting the inductive antenna 1. In this case, a first controllable switch 5 is connected to the upper of the two input paths, said controllable switch alternatively also being able to be connected to the lower of the two input paths.

Connected in series with the switch 5 is a nonreactive resistance 6 that is used for current limiting in the input paths. Instead of the nonreactive resistance 6, it would also be possible to use a current source or another type of current impresser or current limiter. A second controllable switch 7 is connected to the upper of the two output paths and a nonreactive resistance 8, which is used as a measuring resistor for measuring the current Ia flowing through the inductive antenna 1, that is to say as a current measuring device, is connected to the lower of the two output paths. Alternatively, the switch 7 and the resistor 8 could also be arranged in the same input path each time or the respective input paths can be interchanged with one another. For the purpose of current measurement, it is alternatively also possible to evaluate the derivative of the voltage on the capacitor 4.

In addition, the driver circuit comprises a switch control device 9 that taps off a voltage across the resistor 8, which voltage is proportional to the current Ia through the resistor 8 and hence the current through the antenna 1, and evaluates it, for example ascertains the zero crossings of the current Ia. When the second switch 7 is open, the first switch 5 is closed by means of the control signal S1 under the control of the switch control device 9, in order to charge the capacitor 4 to the reference voltage Ur. Subsequently, the first switch 5 is opened and the second switch 7 is closed by means of the control signal S2, in order to discharge the capacitor 4 via the inductive antenna 1 in an oscillating manner, i.e. with at least one full oscillation being performed, the second switch 7 then being opened again only when the current Ia through the inductive antenna 1 has passed through an entire oscillation period (or a multiple thereof). The switch control device 9 additionally has a modulation input for a modulation signal MOD, which will be discussed in more detail below.

Optionally, a third controllable switch 10, possibly together with a series-connected diode 11, may also be connected in parallel with the capacitor 4 directly or—as shown—via the resistor 6, which controllable switch is controlled by means of a control signal S3 such that it shorts, i.e. discharges, the capacitor 4 to deactivate the driver circuit.

Figure 2:
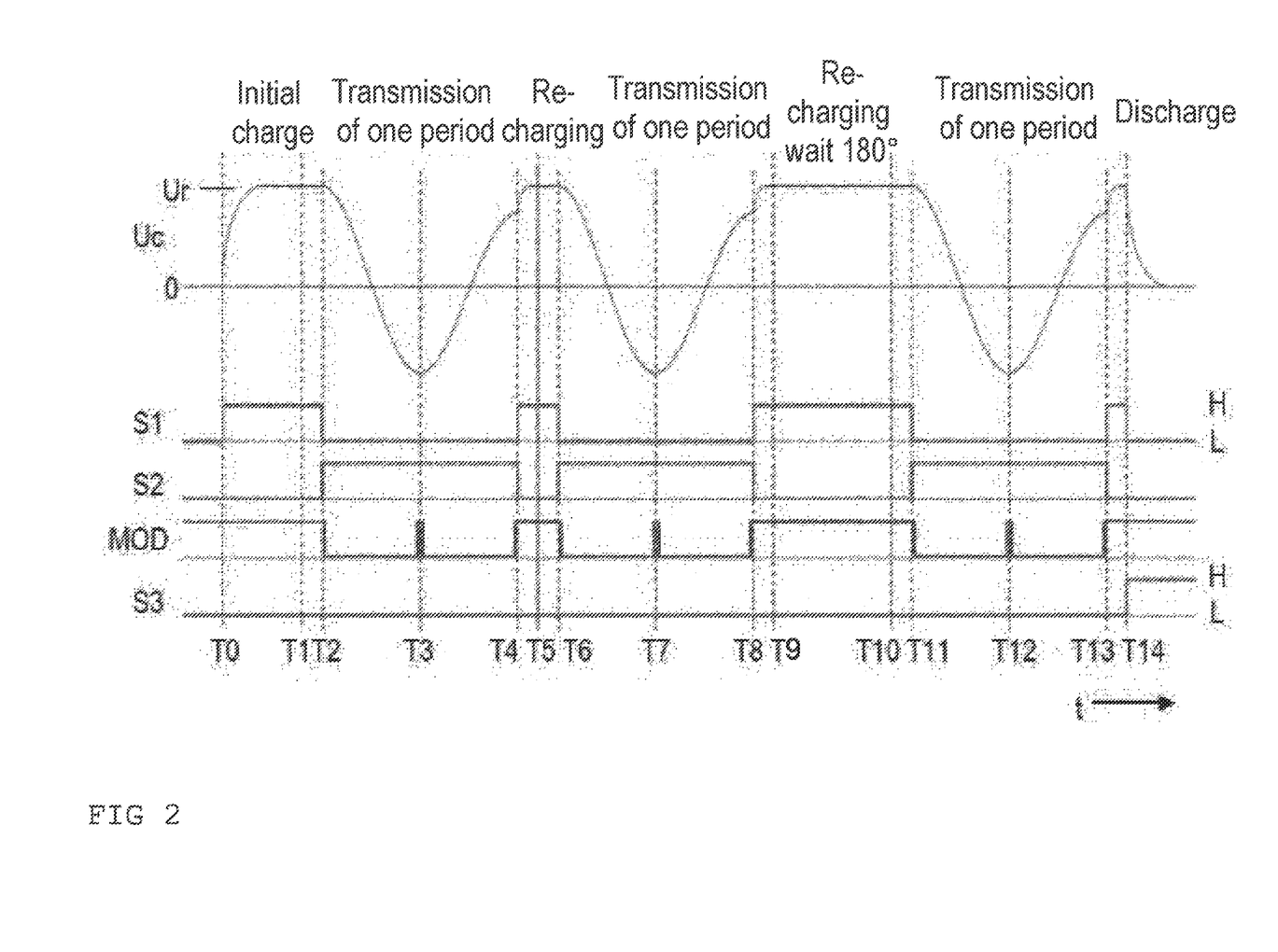
FIG. 2 shows a graph of the profile of the voltage across the capacitor of the driver circuit in relation to control signals for the switches and a modulation signal.

The profile of the voltage Uc over time t on the capacitor 4 on the basis of the control signals S1, S2 and S3 for the case of a biphase shift keying modulation (BPSK modulation) is shown in FIG. 2. At the beginning, at a time T0, the first charging of the capacitor 4 from, for example, 0 V to the reference voltage Ur is begun and, accordingly, the voltage Uc across the capacitor 4 rises from, by way of example, 0 V to the reference voltage Ur (in the present case exponentially). Complete charging is achieved at a time T1. In order to ensure complete charging even with small differences in the operating conditions, changeover between the first switch 5, which is closed for charging (switch 7 opens), and the second switch 7, which is closed for oscillating discharge (switch 5 open), takes place somewhat later than the time T1, namely at a time T2.

Hence, the phase of the oscillating discharge of the capacitor 4 is initiated at the time T2. Accordingly, the voltage Uc is then dropped across the capacitor 4 again (in the present case cosinusoidally), initially reaches zero and then, in accordance with the behavior of the resonant circuit formed from the capacitor 4 and the antenna 1, reaches a negative maximum with a quality-factor-dependent amplitude at a time T3, in order then to rise again approximately to a relative positive maximum with a quality-factor-dependent amplitude at a time T4. Although the positive maximum is more or less approximately equal to the reference voltage Ur, it is lower than it at all events. During the oscillating discharge phase, the antenna 1 transmits an electromagnetic signal. At the time T4, a re-charging phase then begins, during which full charge is reached at a time T5. Changeover from charging to oscillating discharge takes place, again for the reasons already outlined above, at a somewhat later time T6, however. This is in turn followed by an oscillating discharge phase up to a time T8, including the negative maximum being reached at a time T7.

This is again followed by a re-charging phase beginning at the time T8, with full charge being reached during said re-charging phase at a time T9. This is followed by a longer waiting time up to a time T11, however, said waiting time being due to a 180° phase shift on account of the BPSK modulation. For comparison, FIG. 2 also shows a time T10 that indicates the minimum waiting time between the times T10 and T11. From the time T11, an oscillating discharge is in turn effected up to a time T13 with a negative maximum at a time T12. This is also followed by re-charging up to the time T14, said re-charging being terminated, however, on account of deactivation of the driver circuit at the time T14 by a final discharge to approximately 0 V (possible diode voltage across diode 11) by means of the switch 10.

In accordance with the switching behavior of the switches 5, 7 and 10, the control signal S1 is at the level H during each charging phase (between the times T0 and T1, T4 and T6, T8 and T1, T13 and T14) and the control signal S2 is initially at the level L. For the subsequent discharge phase in each case (between the times T2 and T4, T6 and T8, T11 and T13), the control signal S1 changes to the level L and the control signal S2 changes to the level H. The control signal S3 is at the level L up to final discharge at the time T14, and then at the level H. To improve clarity, the exemplary embodiment shown in FIG. 2 fundamentally involves the level H representing a closed switch (on) and the level L representing an open switch (off). However, depending on the type of a single or all switch(es) actually used and the specific signal switching configurations thereof, different actual actuating signals can arise.

The modulation signal MOD, which results in the profile shown in FIG. 2 for the voltage Uc across the capacitor 4, is likewise shown in FIG. 2. The modulation signal MOD is at the level H up to the time T2, is then at the level L up to the time T3, is at the level H at the time T3, is then at the level L up to the time T4, is at the level H from the time T4 to the time T6, is at the level L from the time T6 to the time T8, with the exception of the level H at the time T7, is at the level H from the time T8 to the time T11 and is at the level L from the time T11 to the time T13, with the exception of the level H at the time T13. Essentially, the modulation signal MOD is therefore at the level H in the charging phases of the capacitor 4 and when the negative maximum in the voltage Uc on the capacitor 4 arises, and otherwise at the level L.

Figure 3:
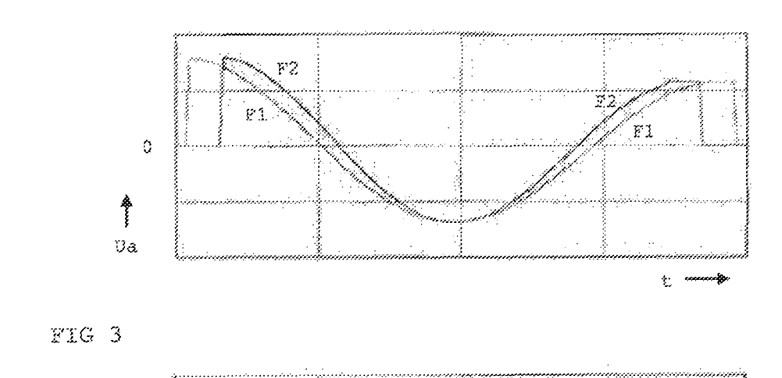
FIG. 3 shows a graph of the profile of the voltage across the antenna at different resonant frequencies in relation to the carrier frequency.
Figure 4:
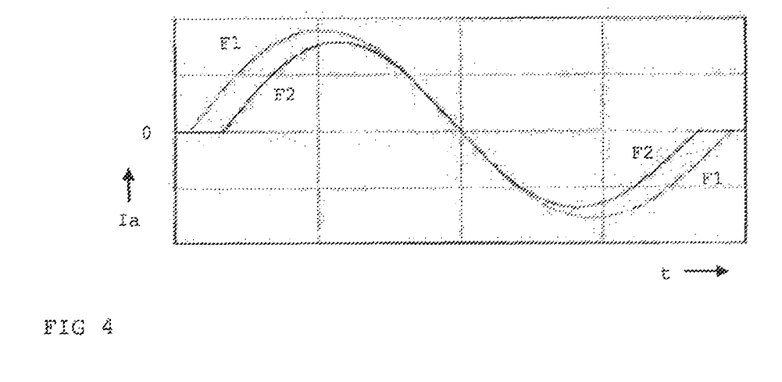
FIG. 4 shows a graph of the profile of the current through the antenna, which corresponds to the voltage profile shown in FIG. 3.

FIG. 3 indicates the profile of the voltage Ua across the antenna 1 over time t for two different resonant frequencies F1 and F2, the resonant frequency F1 being 5% above a desired carrier frequency, and the resonant frequency F2 being 20% above the desired carrier frequency. FIG. 4 shows the respective current profile Ia corresponding thereto over time t for the two resonant frequencies F1 and F2, as presents itself at the resistor 8, for example. As was to be expected, the phase shift between the respective voltages and currents is approximately 90°.

Before the antenna 1 is switched on to the quasi-resonant mode described above, the antenna 1 has zero current (Ia=0 A). The antenna current Ia therefore does not change and the antenna ports X1, X2 are both at the same potential (e.g. ground potential). The antenna voltage Ua is therefore initially 0V. If the antenna 1 is then switched to the quasi-resonant mode, the potential at the second antenna port X2 does not change, whereas the potential at the first antenna port X1 changes such that the antenna voltage Ua becomes equal to the voltage Uc at the capacitor 4 (Ua=Uc). Charge reversals for parasitic capacitances carry no weight in this case. Losses during further operation of the antenna 1 reduce the maximum voltage Ua, so that shortly before shutdown, the antenna voltage Ua is somewhat below the voltage Uc. Following shutdown of the quasi-resonant mode, the antenna voltage Ua drops abruptly to 0V, since the antenna current Ia drops to 0 A again and does not change again.

Whereas the potential of the first antenna port X1 alters when the quasi-resonant mode is switched on and off, the potential of the second antenna port X2 always remains the same. The antenna voltage Ua therefore has a sudden voltage change each time the quasi-resonant mode is switched on and off, as can be seen in FIG. 3. These sudden voltage changes lead to undesirably high emissions in the antenna 1 and also in the antenna ports X1, X2 and the antenna lines.

Figure 5:
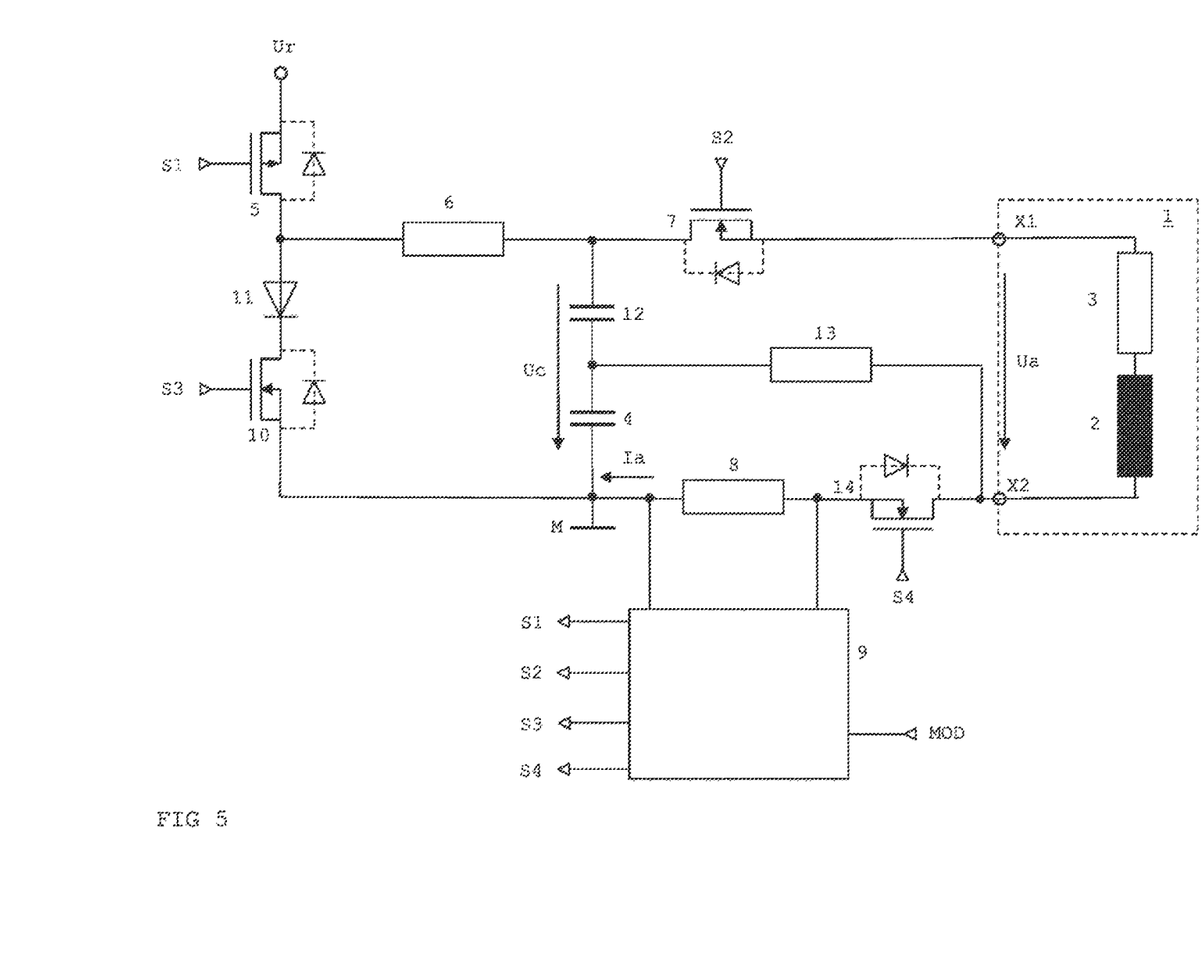
FIG. 5 shows a circuit diagram of an exemplary driver circuit for an inductance in an application as an active transmission device for LF signals.

A driver circuit as shown in FIG. 5 can be used to reduce these emissions. In this case, the driver circuit is based on the driver circuit shown in FIG. 1. However, the first capacitor 4 has a second capacitor 12 connected in series with it. If the first capacitor 4 and the second capacitor 12 each have the same capacitance, then each capacitor 4, 12 has a voltage Uc/2 across it.

A nonreactive resistance 13 is connected between the second antenna port X2 and a common node at the first and second capacitors 4, 12. In addition, a fourth controllable switch 14 is connected between the second antenna port X2 and the resistor 8. The fourth controllable switch 14 can be opened or closed by means of a control signal S4 provided by the switch control device 9. In this case, the control signal S4 essentially corresponds to the control signal S2. That is to say that the fourth controllable switch 14 is opened or closed essentially simultaneously with the second controllable switch 7. Smaller differences between the two control signals S2, S4 are possible, however.

In the present exemplary embodiment, the controllable switches 5, 7, 10 and 14 used are field-effect transistors, particularly MOS field effect transistors (MOS is the abbreviation for the term "metal oxide semiconductor"), the controllable switch 5 being an MOS field effect transistor of p-channel type, while the controllable switches 7, 10 and 14 are of n-channel type. Besides the MOS field effect transistors (of any conduction type) shown, it is also possible to use all other types of suitable controllable switches, particularly of controllable semiconductor switches, naturally also in conjunction with appropriate drivers, bootstrap circuits, charge pumps or the like.

Figure 6:
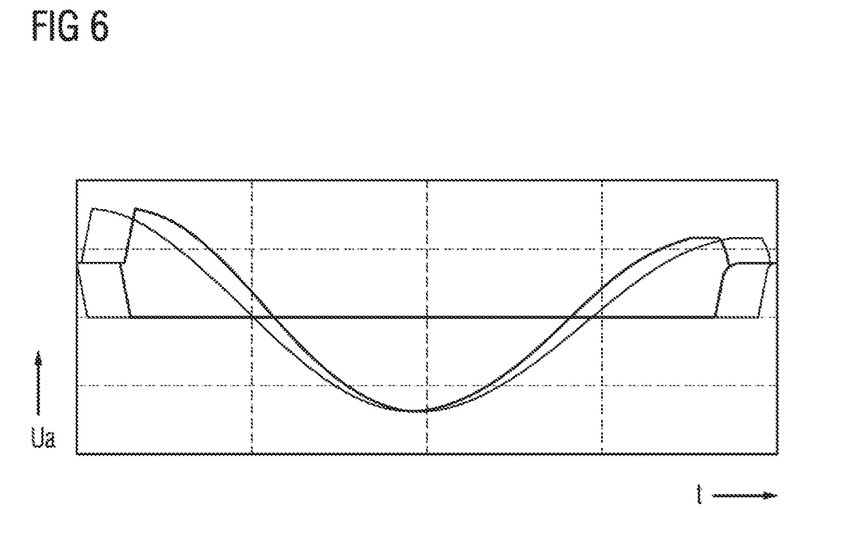
FIG. 6 shows a graph of the profile of the voltage across the antenna at different resonant frequencies in relation to the carrier frequency when the driver circuit according to the invention is used.

If the second switch 7 and the fourth switch 14 are closed, then the profile of the quasi-resonant oscillation is as described above with reference to FIG. 2. Therefore, before the antenna 1 is switched off, there is a voltage Ua on the antenna 1 that, on account of losses, is somewhat below the voltage Uc across the capacitors 4, 12. As already illustrated above, the antenna 1 has zero current again (Ia=0 A) after being switched off. Since the second switch 7 and the fourth switch 14 are open after the antenna 1 is switched off, the resistor 13 means that the potential at the first antenna port X1 changes from Uc to Uc/2. In addition, the potential at the second antenna port X2 also changes from ground potential to Uc/2. The profile of the resultant antenna voltage Ua over time is shown in FIG. 6.

Figure 7:
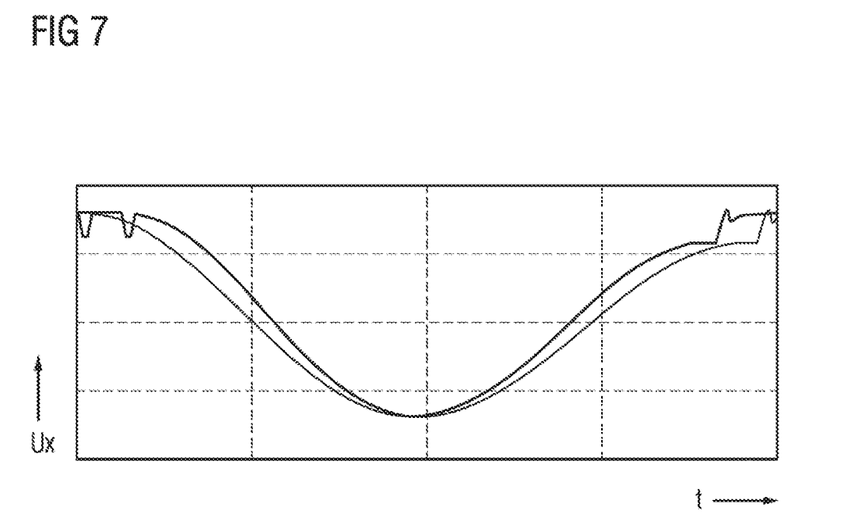
FIG. 7 shows a graph of the profile of the sum of the voltages on the antenna ports, which corresponds to the voltage profile shown in FIG. 6.

The sum Ux of the potentials at the antenna ports X1, X2 therefore does not change significantly during the switching processes in the driver circuit. Slight changes can arise as a result of a slight offset in the actuating signals S2, S4, for example, which is frequently unavoidable. The profile of the sum Ux of the potentials over time is shown in FIG. 7. Since the sum of the potentials at the antenna ports X1, X2 does not change (significantly) during the switching processes, the emission caused by the switching processes is largely reduced to zero.

Figure 8:
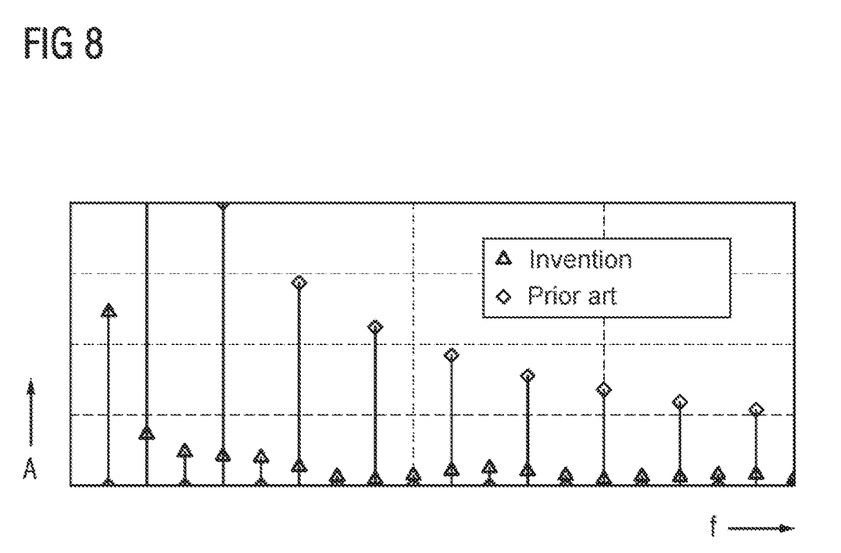
FIG. 8 shows a comparative graph of the harmonics produced during conventional square-wave operation and when the driver circuit according to the invention is used.

FIG. 8 schematically shows the resultant harmonics in the spectra of the signals emitted by the antenna 1 as amplitudes A of the harmonics over frequency f, a fundamental having the same amplitude (not shown) being assumed for both cases. As can be seen, the present method is much more favorable, in comparison with known methods using square-wave signals, in terms of the energy contributed by the harmonics, i.e. it produces less spurious energy and is therefore more advantageous in respect of electromagnetic compatibility (EMC).

Advantages of the driver circuit according to the invention and of the active transmission device according to the invention are that EMC emissions are comparatively very low and that radio approval regulations are complied with.

LIST OF REFERENCE SYMBOLS 1 inductive antenna
2 inductive component
3 nonreactive component
4 first capacitor
5 controllable switch
6 nonreactive resistance
7 controllable switch
8 current measuring device
9 switch control device
10 controllable switch
11 diode
12 second capacitor
13 nonreactive resistance
14 controllable switch
Ur reference voltage
Uc voltage across the capacitors
Ua antenna voltage
Ux sum of the potentials at the antenna ports
Ia antenna current
X1 first antenna port
X2 second antenna port
S1 control signal
S2 control signal
S3 control signal
S4 control signal
MOD modulation signal
F1 first resonant frequency
F2 second resonant frequency

The invention claimed is:

1. A driver circuit for an inductance comprising:
a first capacitor and a second capacitor, the second capacitor connected in a series circuit with the first capacitor,
two input paths for supplying a reference voltage to the series circuit comprising the first capacitor and the second capacitor,
two output paths for connecting the inductance to the series circuit comprising the first capacitor and the second capacitor,
a first controllable switch connected to one of the two input paths,
a second controllable switch connected to one of the two output paths,
a third controllable switch connected to the other one of the two output paths,
a resistor is connected between a common node of the first capacitor and the second capacitor and to the inductance,
a current measuring device connected to one of the two output paths and configured to measure current flowing through the inductance, and
a switch control device connected downstream of the current measuring device, the switch control device configured to evaluate the current flowing through the inductance and to close the first switch initially when the second switch is open and the third switch is open, thereby charging the first capacitor and the second capacitor, so that a voltage across the series circuit comprising the first capacitor and the second capacitor corresponds to the reference voltage, and further configured to then open the first switch and to close the second switch and the third switch simultaneously, thereby discharging the first capacitor and the second capacitor via the inductance in an oscillating manner, the second switch and the third switch being opened again simultaneously when the current through the inductance has passed through an entire oscillation period or a multiple thereof.

2. The driver circuit as claimed in claim 1, wherein the first capacitor and the second capacitor have equal capacitance.

3. The driver circuit as claimed in claim 1, wherein a current limiter or current impresser is connected in series with the first switch.

4. The driver circuit as claimed in claim 1, wherein the switch control device is configured to detect zero crossings of the measured current and, after a number of two or an integer multiple of two zero crossings, to open the second switch and the third switch simultaneously.

5. The driver circuit as claimed in claim 4, wherein the switch control device is configured to perform at least one of a phase shift keying modulation, an amplitude shift keying modulation, a frequency shift keying modulation.

6. The driver circuit as claimed in claim 1, wherein the switch control device has a modulation input for a modulation signal and is configured to control switching cycles of the first switch, of the second switch and of the third switch based on the modulation signal.

7. The driver circuit as claimed in claim 1, wherein at least the first switch, the second switch and the third switch are embodied as controllable semiconductor components.

8. The driver circuit as claimed in claim 1, wherein the current measuring device is embodied as a nonreactive resistance.

9. The driver circuit as claimed in claim 1, wherein the current measuring device is configured to evaluate derivative of the voltage on the series circuit comprising the first capacitor and the second capacitor.

10. The driver circuit as claimed in claim 1, wherein a resonant circuit formed by the series circuit comprising the first capacitor and the second capacitor and by the inductance has a resonant frequency that is higher than a carrier frequency provided for transmission.

11. The driver circuit as claimed in claim 10, wherein the resonant frequency is 5 to 30 percent higher than the carrier frequency provided for transmission.

12. The driver circuit as claimed in claim 1, wherein a fourth controllable switch of the series circuit is connected in parallel with the first capacitor and the second capacitor, the fourth controllable switch being controlled such that it shorts the first capacitor and the second capacitor to deactivate the driver circuit.

13. An active transmission device for a keyless vehicle entry and starting system, comprising:
an inductive antenna,
a first capacitor and a second capacitor, the second capacitor connected in a series circuit with the first capacitor,
a reference voltage source,
two input paths connected between the reference voltage source and the series circuit comprising the first capacitor and the second capacitors,
two output paths connected between the inductive antenna and the series circuit comprising the first capacitor and the second capacitor,
a first controllable switch connected to one of the two input paths,
a second controllable switch connected to one of the two output paths,
a third controllable switch connected to the other of the two output paths,
a resistor connected between a common node of the first capacitor and the second capacitor and to the inductive antenna,
a current measuring device connected to one of the two output paths and configured to measure current flowing through the inductive antenna, and
a switch control device connected downstream of the current measurement device, configured to evaluate the current flowing through the inductive antenna and to close the first switch initially when the second switch is open and the third switch is open, thereby charging the series circuit comprising the first capacitor and the second capacitor to a voltage corresponding to a reference voltage, and further configured to then open the first switch and to close the second switch and the third switch simultaneously, thereby discharging the capacitors via the inductive antenna in an oscillating manner, the second switch and the third switch being opened again simultaneously when the current through the inductive antenna has passed through an entire oscillation period or a multiple thereof.

* * * * *